(12) United States Patent
Inoue

(10) Patent No.: US 12,400,973 B2
(45) Date of Patent: Aug. 26, 2025

(54) SEMICONDUCTOR DEVICE

(71) Applicant: FUJI ELECTRIC CO., LTD., Kawasaki (JP)

(72) Inventor: Daisuke Inoue, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 437 days.

(21) Appl. No.: 18/146,837

(22) Filed: Dec. 27, 2022

(65) Prior Publication Data

US 2023/0260932 A1 Aug. 17, 2023

(30) Foreign Application Priority Data

Feb. 16, 2022 (JP) ................................. 2022-021954

(51) Int. Cl.
*H01L 23/00* (2006.01)
*H01L 23/053* (2006.01)
*H01L 23/31* (2006.01)
*H01L 23/49* (2006.01)

(52) U.S. Cl.
CPC .......... *H01L 23/562* (2013.01); *H01L 23/053* (2013.01); *H01L 23/3121* (2013.01); *H01L 23/49* (2013.01); *H01L 24/48* (2013.01); *H01L 2224/48177* (2013.01)

(58) Field of Classification Search
None
See application file for complete search history.

(56) References Cited

U.S. PATENT DOCUMENTS

| 9,761,462 B2 | 9/2017 | Takizawa |
| 10,325,825 B2 | 6/2019 | Aoki et al. |
| 2015/0371931 A1* | 12/2015 | Nishida .................. H01L 24/92 174/255 |
| 2016/0155687 A1 | 6/2016 | Takizawa |
| 2019/0103329 A1 | 4/2019 | Aoki et al. |

FOREIGN PATENT DOCUMENTS

| JP | 2000349219 A | * 12/2000 | ............. H01L 24/49 |
| JP | 2016111028 A | 6/2016 | |
| JP | 2017199818 A | 11/2017 | |
| JP | 2019067885 A | 4/2019 | |
| WO | 2015152373 A | 10/2015 | |

* cited by examiner

*Primary Examiner* — Sue A Purvis
*Assistant Examiner* — Jordan M Klein

(57) ABSTRACT

A semiconductor device includes case resin having frame part defining space in which semiconductor chip is disposed and bottom part located under the frame portion; external connection terminal having external terminal partially embedded in the frame part, and internal terminal disposed on the bottom part to extend from the external terminal into the space; wire electrically connecting the semiconductor chip and the internal terminal; and sealing resin formed in the space to cover the semiconductor chip, the wire, and the internal terminal. The internal terminal has rectangular connecting portion, and step portions disposed at opposite ends of the connecting portion, respective portions of the upper surfaces of the step portions facing each other are covered with vibration controlling portions implemented by the case resin, and the sealing resin is filled in first grooves exposing other portions of the upper surfaces of the step portions.

4 Claims, 7 Drawing Sheets

SEMICONDUCTOR DEVICE

CROSS REFERENCE TO RELATED APPLICATIONS

This application is based upon and claims the benefit of priority from the prior Japanese Patent Application No. P2022-021954 filed on Feb. 16, 2022, the entire contents of which are incorporated herein by reference.

BACKGROUND OF THE INVENTION

1. Field of the Invention

The present invention relates to a semiconductor device and more particularly a power semiconductor device.

2. Description of the Related Art

In a power semiconductor device, such as a power converter, a switching device and the like, a circuit board on which semiconductor elements are arranged is housed in a resin case integrally formed with external connection terminals by insert molding. The case is integrally formed with the external connection terminals including power terminals for power input/output and signal terminals for signal input/output by insert molding. When the semiconductor device operates, the semiconductor elements generate heat. As the operation time of the semiconductor device becomes longer, deterioration, such as cracks in the bonding materials for bonding the semiconductor elements and the power terminals to the circuit board and deformation of the wires bonded to the semiconductor elements occurs. To prevent such deterioration, the semiconductor elements inside the case are sealed with resin.

Since the difference in the linear expansion coefficient between the sealing resin and the case material is large, the sealing resin may be peeled off from the case material due to occurrence of repeated stress in the heat cycle by heat generation of the semiconductor elements and temperature change in the external atmosphere. Therefore, reliability may be reduced due to disconnection of wires bonded to the semiconductor elements or moisture absorption from the gap between the case material and the sealing resin.

JP 2017-199818 A describes improving the adhesion between the case material and the sealing resin with grooves disposed on both sides of the external connecting portion of the external connection terminal along the periphery of the bottom of the case, and preventing degradation in the bonding property with the vibration controlling portion disposed in the groove adjacent to the internal connecting portion. JP 2000-349219 A discloses that the step portion is formed at the end of the external connection terminal apart from the wire bonding portion to secure the area of the wire bonding portion and improve adhesion between the external connection terminal and the case resin. JP 2016-111028 A discloses that the case material is placed in the recessed portion formed at the tip of the internal connecting portion to fix the internal connecting portion, to prevent the occurrence of a gap in the lower portion of the internal connecting portion at the time of tie-bar cutting of the insert-molded lead frame. JP 2019-67885 A discloses that the recessed portion or the bent portion is formed on the back side of the internal connecting portion to improve the degree of adhesion between the case material and the internal connecting portion and to secure the area of the wire bonding portion. WO 2015/152373 describes exposing the wire bonding portion in the recess of the case material disposed at the tip of the internal connecting portion to prevent the sealing resin and the external connection terminal from peeling off and to prevent wire disconnection.

Conventionally, in order to improve the adhesion between the case resin and the sealing resin, a contact surface of the case resin are addressed by application of coating material or roughening. However, the application of the coating material increases the manufacturing cost due to addition of the material and manufacturing processes. The coating material may be difficult to apply depending on the internal shape of the case. To roughen the contact surface, it is necessary to roughen the inner surface of the molding die by electric discharge machining or the like. Wear of the inner surface of the mold lowers surface roughness and deteriorates adhesion. Therefore, the management and maintenance of the molding die are required, and the manufacturing cost increases.

SUMMARY OF THE INVENTION

An aspect of the present invention inheres in a semiconductor device, including: (a) a case resin having a frame part defining a space in which a semiconductor chip is disposed, and a bottom part located under the frame portion; (b) an external connection terminal having an external terminal partially embedded in the frame part, and an internal terminal disposed on the bottom part so as to extend from the external terminal into the space; (c) a wire electrically connecting the semiconductor chip and the internal terminal; and (d) a sealing resin formed in the space to cover the semiconductor chip, the wire, and the internal terminal, wherein, the internal terminal has a rectangular connecting portion in plan view, and step portions disposed at opposite ends of the connecting portion in parallel with an extending direction of the internal terminal into the space, upper surfaces of the step portions are lower than an upper surface of the connecting portion, respective portions of the upper surfaces of the step portions facing each other are covered with vibration controlling portions implemented by the case resin, and the sealing resin is filled in first grooves exposing other portions of the upper surfaces of the step portions.

DETAILED DESCRIPTION

Hereinafter, embodiments of the present invention will now be described with reference to the drawings. In the description of the drawings, the same or similar parts are denoted by the same or similar numerals, and duplicate descriptions are omitted. However, the drawings are schematic, and the relationship between the thickness and the plane dimension, the ratio of the thickness of each layer, and the like may be different from the actual ones. Also, portions having different dimensional relationships and ratios may be included among the drawings. Further, the following embodiments exemplify apparatuses and methods for embodying the technical idea of the present invention, and the technical idea of the present invention does not specify the material, shape, structure, arrangement, etc. of the components as follows.

Further, the definition of the vertical direction or the like in the following description is merely a definition for convenience of explanation and does not limit the technical idea of the present invention. For example, in the following description, "top" and "bottom" in the "top conductive layer" and "bottom conductive layer" are only choices for convenience and are not defined with respect to the direction of gravity of the earth. Therefore, it is needless to say that when the object is rotated by 90° and observed, the top and bottom are converted to the right and left and read, and when the object is rotated by 180° and observed, the top and bottom are inverted and read.

In the following description, a three-phase inverter circuit will be used as a representative example of a semiconductor device, but the semiconductor device of the present invention is not limited to the three-phase inverter circuit, and may be a power module such as a full bridge circuit or a half bridge circuit. Although an insulating gate bipolar transistor (IGBT) is used as the switching transistor of the inverter circuit, the description is not limited. For example, it may be a bipolar device such as an electrostatic induction thyristor (SI thyristor) or a gate turn-off (GTO) thyristor, or it may be a MOS field effect transistor (FET), a MISFET, an electrostatic induction transistor (SIT), or the like. As the reflux diode D of the inverter circuit, a fast barrier diode (FRD), a Schottky barrier diode (SBD), or the like can be employed.

Embodiments

Figure 1:
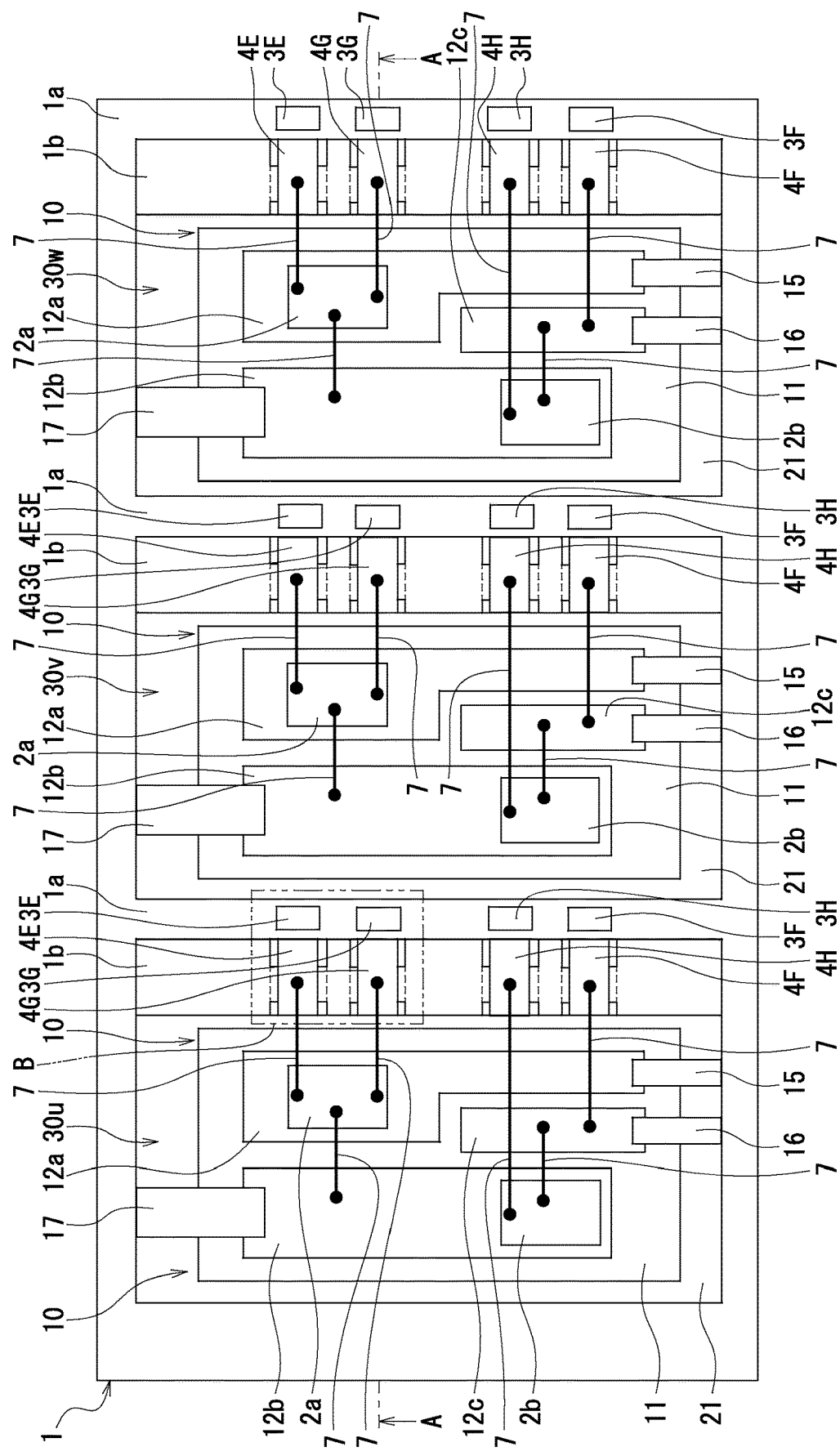
FIG. 1 is a schematic plan view illustrating an example of a semiconductor device according to an embodiment of the present invention.
Figure 2:
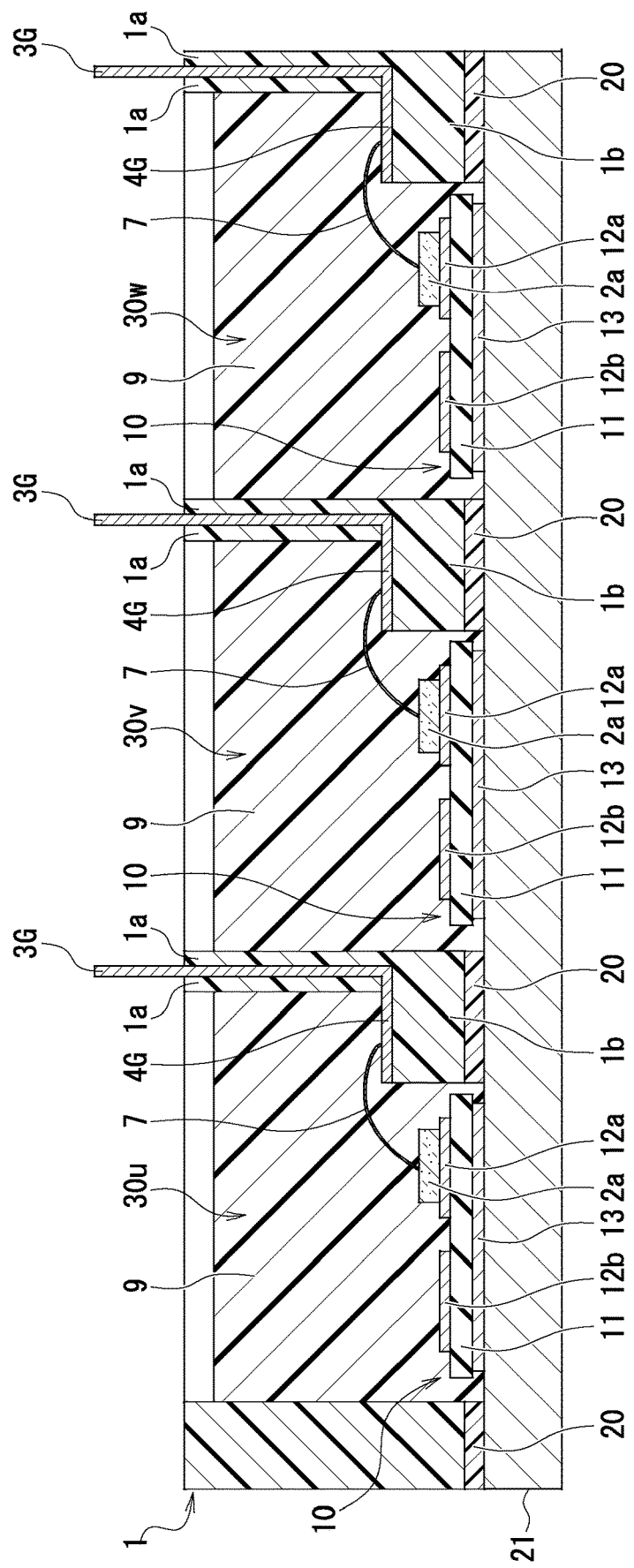
FIG. 2 is a schematic cross-sectional view taken along line A-A in FIG. 1.

As illustrated in FIGS. 1 and 2, a semiconductor device according to an embodiment of the present invention is a semiconductor power module encompassing a three-phase inverter circuit housed in a case resin 1. The case resin 1 has a frame part 1a defining respective spaces in which leg circuits 30u, 30v, 30w implementing a 3-phase inverter circuit are disposed, and a bottom part 1b located in a bottom of the frame part 1a. The bottom part 1b extends from the frame part 1a to the space defined by the frame part 1a. The case resin 1 has terminals including external connection terminals (3E, 4E), (3G, 4G), (3F, 4F), (3H, 4H), positive terminals 15, negative terminals 16, and output terminals 17. The terminals are integrally formed by insert molding, with a metallic lead frame into the case resin 1. The external connection terminal (3E, 4E) has an external terminal 3E embedded and fixed in the frame part 1a, and an internal terminal 4E extending from the external terminal 3E into the space defined by the frame part 1a and disposed on the bottom part 1b. The external connection terminal (3G, 4G) has an external terminal 3G embedded and fixed in the frame part 1a, and an internal terminal 4G extending from the external terminal 3G into the space defined by the frame part 1a and disposed on the bottom part 1b. The external connection terminal (3F, 4F) has an external terminal 3F embedded and fixed in the frame part 1a, and an internal terminal 4F extending from the external terminal 3F and disposed on the bottom part 1b. The external connection terminal (3H, 4H) has an external terminal 3H embedded and fixed in the frame part 1a, and an internal terminal 4H extending from the external terminal 3H and disposed on the bottom part 1b.

The case resin 1 is fixed to a cooling plate 21 by an adhesive 20. The case resin 1 is formed, for example, of an insulating thermoplastic resin. For the thermoplastic resin, polyphenylene sulfide (PPS) resin, polybutylene terephthalate (PBT) resin, polybutylene succinate (PBS) resin, polyamide (PA) resin, acrylonitrile butadiene styrene (ABS) resin and the like may be suitably used.

The respective leg circuits 30u, 30v, 30w include semiconductor chips 2a, 2b mounted on respective insulated circuit boards 10. As illustrated in FIG. 2, each of the insulated circuit boards 10 includes an insulating plate 11, conductor layers 12a, 12b, 12c patterned on an upper surface of the insulating plate 11, and a conductor layer 13 disposed on a lower surface of the insulating plate 11. As illustrated in FIG. 1, the semiconductor chip 2a is disposed on the conductor layer 12a, and the semiconductor chip 2b is disposed on the conductor layer 12b. The insulated circuit board 10 is joined to the cooling plate 21 via the conductor layer 13 by a jointing material such as solder. The insulated circuit board 10 may be, for example, a direct copper bonding (DCB) substrate in which copper is eutectically bonded to the surface of a ceramic substrate, an AMB substrate in which a metal is arranged on the surface of the ceramic substrate by an active metal brazing (AMB) method, or the like. The material of the ceramic substrate may be, for example, silicon nitride ($Si_3N_4$), aluminum nitride (AlN), alumina ($Al_2O_3$) or the like.

As illustrated in FIG. 2, sealing resins 9, which are omitted in FIG. 1, are formed in the spaces defined by the frame parts 1a of the case resin 1 so as to cover the insulated circuit boards 10 on which the semiconductor chips 2a, 2b are mounted, wires 7, and the internal terminals 4G, 4E, 4F, 4H. Although epoxy resin is used for the sealing resins 9, other resin may be used. For example, a thermoplastic resin with excellent insulating and adhesive properties, such as silicone resin, urethane resin, polyimide resin, polyamide resin, polyamideimide resin, and the like, which are different from case resin 1, can be adopted.

Figure 3:
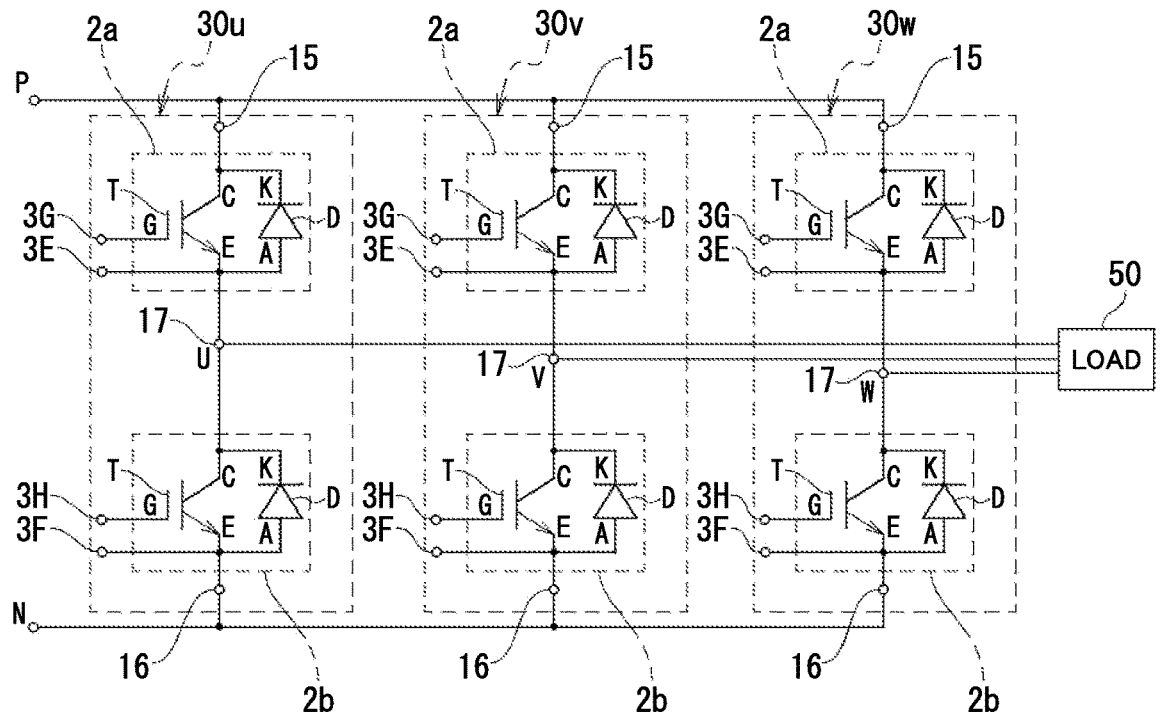
FIG. 3 is a circuit diagram illustrating an example of a semiconductor device according to an embodiment of the present invention.

In each of the leg circuits 30u, 30v, 30w, for example, an upper arm is implemented with the semiconductor chip 2a and a lower arm is implemented with the semiconductor chip 2b, as illustrated in FIG. 3. Each of the semiconductor chips 2a, 2b has a switching transistor T made of an IGBT and a freewheeling diode D connected in antiparallel to the switching transistor T. A cathode electrode K of the freewheeling diode D is electrically connected to a collector electrode C of the switching transistor T. An anode electrode A of the freewheeling diode D is electrically connected to an emitter electrode E of the switching transistor T. The collector electrodes C in the semiconductor chips 2a are electrically connected to the positive terminals 15, respectively. The emitter electrodes E in the semiconductor chips 2b are electrically connected to the negative terminals 16, respectively. Each emitter electrode E in the semiconductor chips 2a and each collector electrode C in the semiconductor chips 2b are electrically connected to the output terminals 17, respectively.

As illustrated in FIG. 1, a gate electrode G of each switching transistor T in the semiconductor chips 2a is electrically connected to the internal terminal 4G via the wire 7. An auxiliary emitter electrode (not shown) electrically connected to each emitter electrode E in the semiconductor chips 2a is electrically connected to the internal terminal 4E via the wire 7. A gate electrode G of each switching transistor T in the semiconductor chips 2b is electrically connected to the internal terminal 4H via the wire 7. An auxiliary emitter electrode (not shown) electrically connected to each emitter electrode E in the semiconductor chips 2b is electrically connected to the internal terminal 4F via a wire 7. A resistance element for adjusting a switching speed and a loss may be added to the gate electrode G. The auxiliary emitter electrode is an auxiliary electrode for detecting a voltage or the like on the emitter electrode side.

In each of the leg circuits 30u, 30v, and 30w, as illustrated in FIG. 3, a connection node between the emitter electrode E of the semiconductor chip 2a and the collector electrode C of the semiconductor chip 2b are electrically connected to the output terminal 17. For example, during operation of the semiconductor device according to the embodiment, a positive electrode P and a negative electrode N of an external DC power source (not shown) are connected to the positive terminals 15 and the negative terminals 16 of the leg circuits 30u, 30v, 30w, respectively. In each of the leg circuits 30u, 30v, 30w, a pulse signal is fed from a control circuit (not shown) to the respective gate electrodes G via the external terminals 3G, 3H, and a reference signal is fed to the respective emitter electrodes E via the external terminals 3E, 3F. As a result, for example, U-phase AC power is supplied from the output terminal 17 of the leg circuit 30u, V-phase AC power is supplied from the output terminal 17 of the leg circuit 30v, and W-phase AC power is supplied from the output terminal 17 of the leg circuit 30w. And thus, 3-phase AC power is supplied to a load 50 such as a motor.

Figure 4:
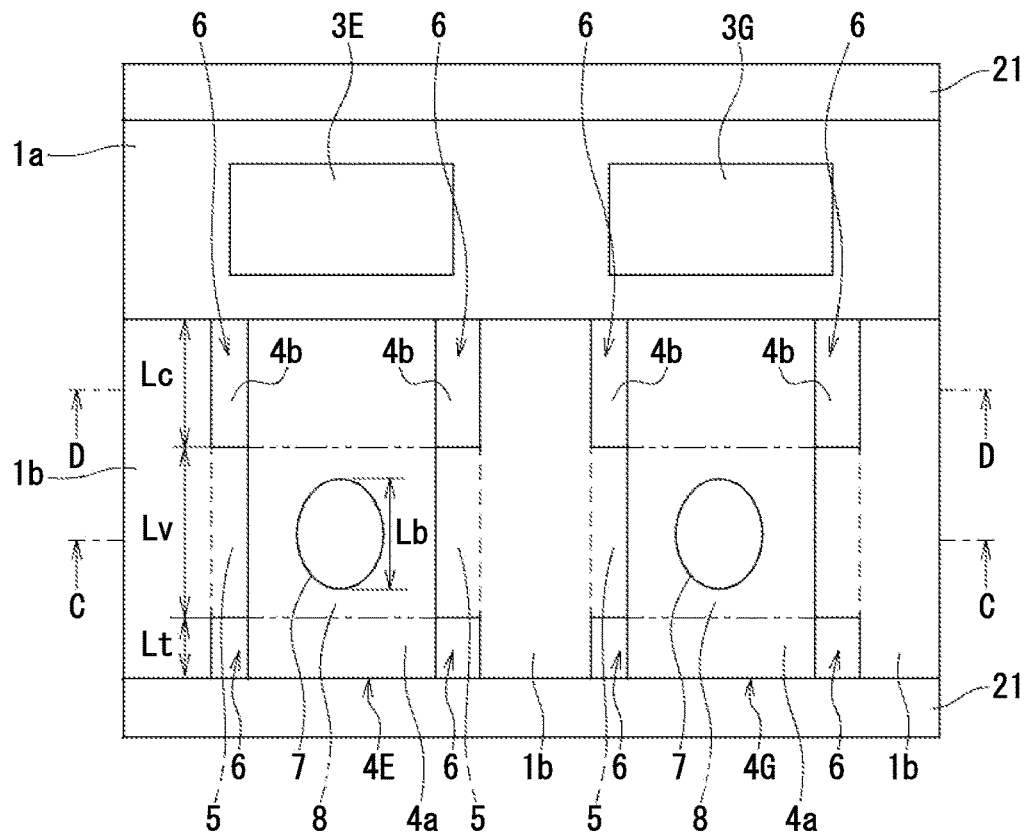
FIG. 4 is an enlarged view of portion B in FIG. 1.
Figure 5:
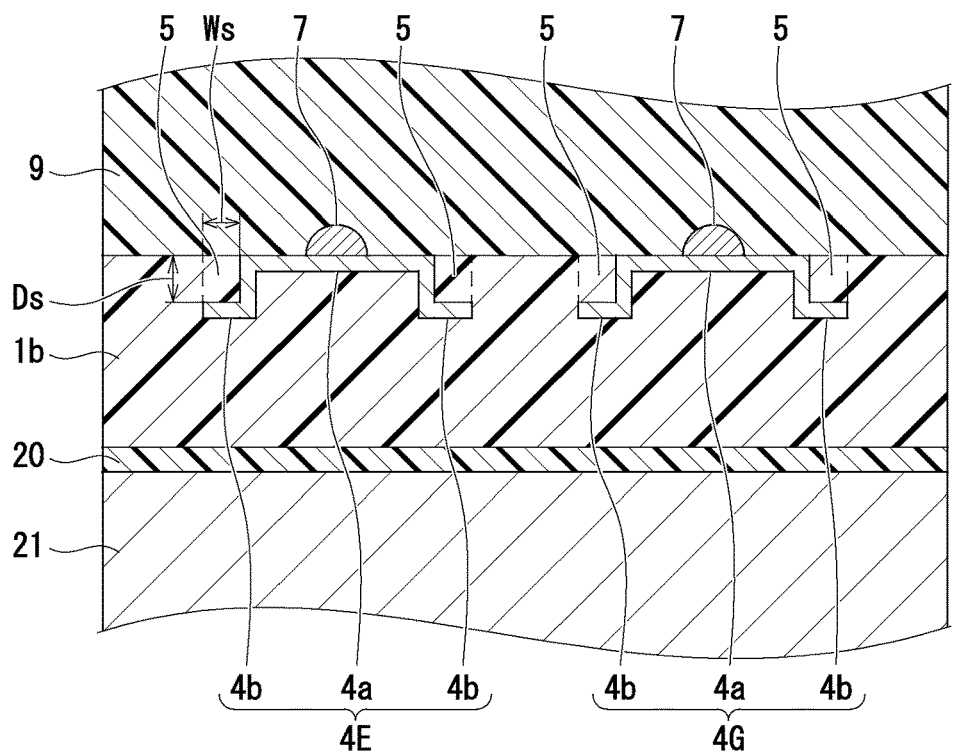
FIG. 5 is a schematic cross-sectional view taken along the line C-C in FIG. 4.
Figure 6:
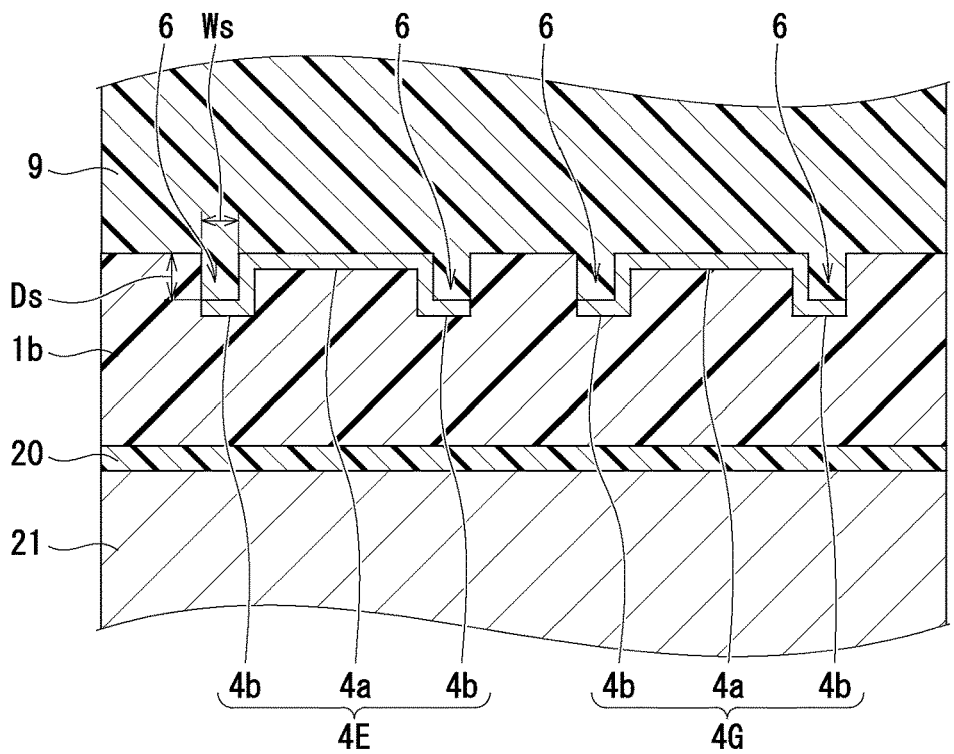
FIG. 6 is a schematic cross-sectional view taken along the D-D direction in FIG. 4.

FIG. 4 is an enlarged view of portion B illustrated in FIG. 1, and illustrates configurations of the external connection terminals (3E, 4E), (3G, 4G) integrally molded with the case resin 1. In FIG. 4, the sealing resin 9 is omitted from illustration. FIG. 5 is a schematic cross-sectional view perpendicularly taken from line C-C in FIG. 4 passing through the bonding end of the wire 7, and FIG. 6 is a schematic cross-sectional view perpendicularly taken from line D-D in FIG. 4 avoiding the bonding end of the wire 7. Note that the external connection terminals (3F, 4F), (3H, 4H) have the same configuration as the external connection terminals (3E, 4E), (3G, 4G). As illustrated in FIGS. 4 to 6, each of the internal terminals 4E, 4G of the external connection terminals (3E, 4E), (3G, 4G) includes a connecting portion 4a and step portions 4b. The connecting portion 4a has a rectangular shape in a plan view. The step portions 4b are disposed at opposite ends of the connecting portion 4a in parallel with an extending direction of the internal terminal 4E or 4G from the external terminal 3E or 3G into the space where the semiconductor chips 2a, 2b are disposed. Each of the step portions 4b has a width Ws, and each upper surface of the step portions 4b is lower than an upper surface of the connecting portion 4a by a depth Ds. The upper surface of the connecting portion 4a is planar at a level substantially the same height as the upper surface of the bottom part 1b.

As illustrated in FIG. 4, grooves (first grooves) 6 exposing the upper surfaces of the step portions 4b are located between the bottom part 1b and the connecting portion 4a in adjacent sides to the frame part 1a and in tip sides of the internal terminals 4E, 4G. The grooves 6 are separately disposed, and have lengths Lc in the adjacent sides to the frame part 1a and lengths Lt in the tip sides of the internal terminals 4E and 4G, for example. As illustrated in FIG. 6, the sealing resin 9 is filled in the grooves 6 where the upper surfaces of the step portions 4b are exposed. For example, the PPS resin used for the case resin 1 and the epoxy resin used for the sealing resin 9 have different linear expansion coefficients and have poor adhesion. In a conventional semiconductor device, the sealing resin made of epoxy resin may be easily peeled off from the case resin made of PPS resin due to occurrence of repeated stress caused by heat generation of the semiconductor chip. Therefore, breaking of the wire connecting the semiconductor chip to the external connection terminal and moisture absorption from the gap between the case resin and the sealing resin are likely to occur. In the semiconductor device according to the embodiment, the grooves 6 are disposed in the bottom part 1b of the case resin 1, and the sealing resin 9 is filled in the grooves 6 in which the upper surfaces of the step portions 4b are exposed. Therefore, the sealing resin 9 is into contact with the metal surfaces of the step portions 4b. The step portion 4b made of metal is superior to the case resin 1 in adhesion with the sealing resin 9. Therefore, the adhesion between the sealing resin 9 and the case resin 1 can be improved. Additionally, since the sealing resin 9 is filled in the groove 6, the adhesion can be further improved by the anchor effect.

Further, as illustrated. FIG. 4, vibration controlling portions 5 are defined between the grooves 6 to selectively cover the upper surfaces of the step portions 4b with the case resin 1. The vibration controlling portions 5 are provided with a length Lv. As illustrated in FIG. 5, both ends of the connecting portions 4a of the internal terminals 4E, 4G are fixed so as to fix the step portions 4b by the vibration controlling portions 5 defined in the bottom part 1b of the case resin 1. Since the wires 7 are bonded to the upper surfaces of the connecting portions 4a by ultrasonic bonding, there is a concern about degradation in the bondability of the wire due to the vibration of the ultrasonic waves applied during bonding. In the semiconductor device according to the embodiment, the vibration of the connecting portions 4a during ultrasonic bonding is controlled by fixing the connecting portions 4a via the vibration controlling portions 5 disposed on the step portions 4b of the internal terminals 4E, 4G. As illustrated in FIG. 4, in order to control the vibration more effectively, it is preferable to join the wire 7 so that the bonding end of the wire 7 is placed in a bonding area 8 defined by the opposing vibration controlling portions 5. In a plan view, the bonding area 8 has the same length Lv as the vibration controlling portion 5 in the extending direction from the external terminals 3E, 3G to the space defined by the frame part 1a. The length Lv of the bonding area 8 is longer than the length Lb of the bonding end of the wire 7. Thus, by including the bonding end of the wire 7 in the bonding area 8, the longitudinal and lateral vibrations of ultrasonic waves applied at the time of wire bonding of the wire 7 can be controlled.

Figure 7:
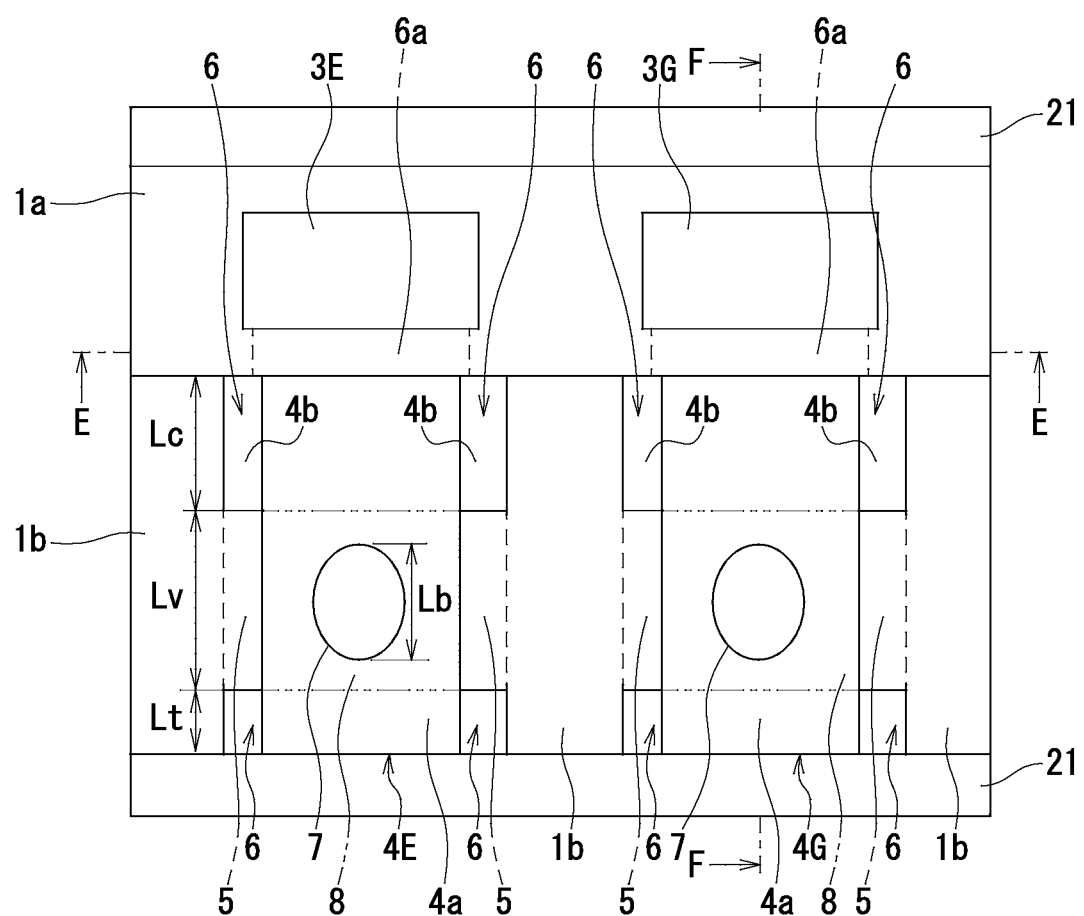
FIG. 7 is a schematic plan view illustrating another example of a semiconductor device according to an embodiment of the present invention.
Figure 8:
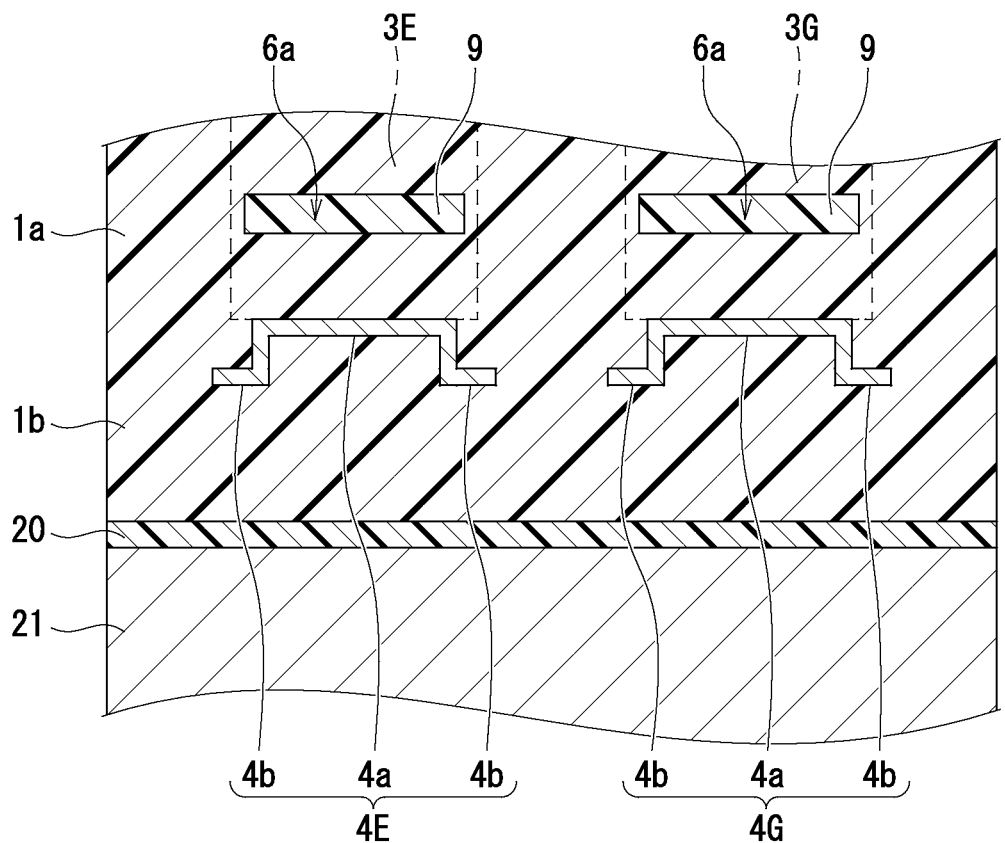
FIG. 8 is a schematic cross-sectional view taken along the line E-E in FIG. 7.
Figure 9:
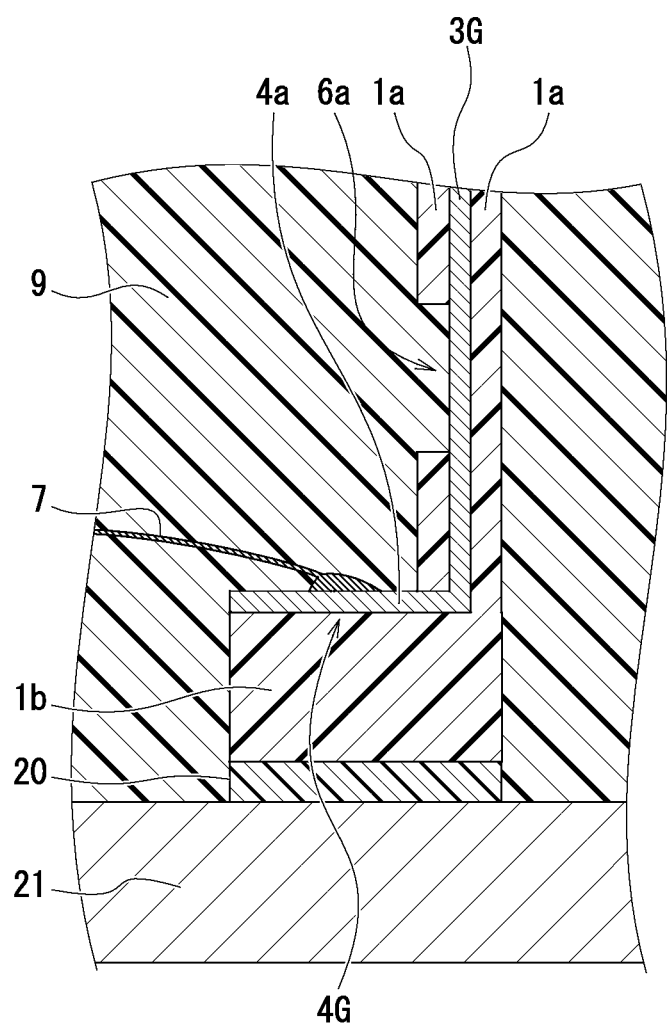
FIG. 9 is a schematic cross-sectional view taken along the line F-F in FIG. 7.

In the above description, in order to improve the adhesion between the sealing resin 9 and the case resin 1, the grooves 6 are disposed in the bottom part 1b of the case resin 1, but the grooves may be further disposed in the frame part 1a. For example, FIG. 7 is an enlarged view corresponding to the portion B illustrated in FIG. 1, FIG. 8 is a schematic cross-sectional view perpendicularly taken from line E-E in FIG. 7, and FIG. 9 is a schematic cross-sectional view perpendicularly taken from line F-F in FIG. 7. As illustrated in FIGS. 7 to 9, grooves (second grooves) 6a are disposed on the side wall of the frame part 1a of the case resin 1. The metal surfaces of the external terminals 3E, 3G are partially exposed in the grooves 6a, and the sealing resin 9 filled in the grooves 6a is into contact with the metal surfaces of the external terminals 3E, 3G. Therefore, the adhesion between the sealing resin 9 and the case resin 1 can be improved.

Additionally, since the sealing resin 9 is filled in the grooves 6a, the adhesion can be further improved by the anchor effect. In addition, insert molding is executed multiple times, for example, twice, to form the grooves 6a on the side wall of the frame part 1a. Only the part corresponding to the frame part 1a in which lead frames for the external connection terminals are embedded is molded by the primary insert molding to form the grooves 6a on the side wall of the part corresponding to the frame part 1a. Next, the remaining part including the bottom part 1b is molded by secondary insert molding to form the case resin 1.

OTHER EMBODIMENTS

Although the present invention has been described in accordance with the above-disclosed embodiments, it should not be understood that the statements and drawings forming part of this disclosure are intended to limit the present invention. It should be appreciated that the disclosure of the description and drawings of the present invention will reveal various alternative embodiments, embodiments, and operational techniques to those skilled in the art. Moreover, the present invention naturally includes various embodiments not described herein, such as a configuration in which the respective configurations described in the above embodiments and the respective modifications are optionally applied. Therefore, the technical scope of the invention is determined only by the matters specifying the invention in the claims, which are reasonable from the above exemplary description.

What is claimed is:

1. A semiconductor device comprising:
a case resin having a frame part defining a space in which a semiconductor chip is disposed, and a bottom part located under the frame portion;
an external connection terminal having an external terminal partially embedded in the frame part, and an internal terminal disposed on the bottom part so as to extend from the external terminal into the space;
a wire electrically connecting the semiconductor chip and the internal terminal; and
a sealing resin formed in the space to cover the semiconductor chip, the wire, and the internal terminal, wherein,
the internal terminal has a rectangular connecting portion in plan view, and step portions disposed at opposite ends of the connecting portion in parallel with an extending direction of the internal terminal into the space, upper surfaces of the step portions are lower than an upper surface of the connecting portion,
respective portions of the upper surfaces of the step portions facing each other are covered with vibration controlling portions implemented by the case resin, and
the sealing resin is filled in first grooves exposing other portions of the upper surfaces of the step portions.

2. The semiconductor device according to claim 1, wherein a bonding end of the wire on the connecting portion is placed in a bonding area defined by the opposing vibration controlling portions.

3. The semiconductor device according to claim 1, wherein the frame part is provided with a second groove in which a surface of the external terminal is partially exposed and the sealing resin is filled.

4. The semiconductor device according to claim 1, wherein the first grooves are separately disposed across the vibration suppression portion in the extending direction.

* * * * *